(12) United States Patent
Nishimura et al.

(10) Patent No.: US 8,233,335 B2
(45) Date of Patent: Jul. 31, 2012

(54) SEMICONDUCTOR STORAGE DEVICE AND DATA READOUT METHOD

(75) Inventors: Hisaaki Nishimura, Kanagawa (JP); Katsuhiko Hoya, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 12/883,731

(22) Filed: Sep. 16, 2010

(65) Prior Publication Data
US 2011/0158008 A1 Jun. 30, 2011

(30) Foreign Application Priority Data
Dec. 25, 2009 (JP) ................................. 2009-296267

(51) Int. Cl.
*G11C 7/00* (2006.01)
(52) U.S. Cl. ............ 365/189.15; 365/233.1; 365/233.13; 365/205
(58) Field of Classification Search .............. 365/189.15, 365/233.13, 233.1, 205
See application file for complete search history.

(56) References Cited

U.S. PATENT DOCUMENTS

| | | | |
|---|---|---|---|
| 6,011,751 A * | 1/2000 | Hirabayashi | 365/236 |
| 6,407,963 B1 * | 6/2002 | Sonoda et al. | 365/233.5 |
| 6,512,719 B2 | 1/2003 | Fujisawa et al. | |
| 6,522,599 B2 * | 2/2003 | Ooishi et al. | 365/189.15 |
| 2005/0138277 A1 | 6/2005 | Koo | |

FOREIGN PATENT DOCUMENTS

| | | |
|---|---|---|
| JP | 7-282000 | 10/1995 |
| JP | 2000-10857 | 1/2000 |
| JP | 2000-57051 | 2/2000 |
| JP | 2003-308694 | 10/2003 |

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor storage device, a first internal bus, a second internal bus, and a third internal bus have bus widths decreasing stepwise from a memory cell array side to a data output circuit side. A first selection circuit and a second selection circuit divide the data, which is input via the first or second internal bus, according to a rate of a decrease in bus width in an input and an output, time-divide the divided data, and output the divided data to the second or third internal bus.

19 Claims, 11 Drawing Sheets

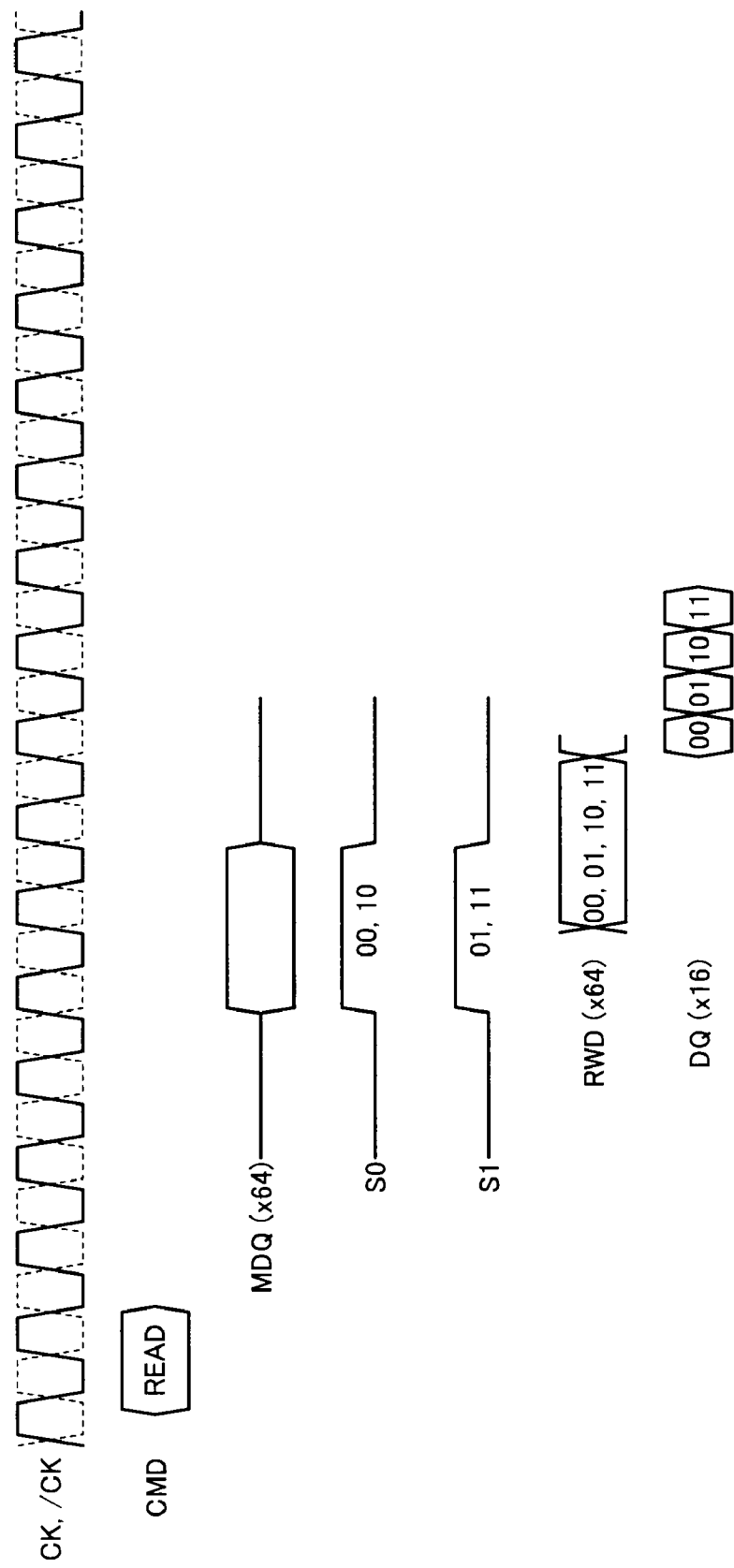

IN THE CASE OF START ADDRESS = "01" AND INTERLEAVE OPERATION

SEMICONDUCTOR STORAGE DEVICE AND DATA READOUT METHOD

CROSS-REFERENCE TO RELATED APPLICATIONS

This application is based upon and claims the benefit of priority from the prior Japanese Patent Application No. 2009-296267, filed on Dec. 25, 2009; the entire contents of which are incorporated herein by reference.

FIELD

Embodiments described herein relate generally to a semiconductor storage device and a data readout method.

BACKGROUND

In the past, in a memory that adopts a double data rate (DDR) interface, reads out data from a memory cell array to a data amplifier via a main data line (MDQ), and transfers the data from the data amplifier to a data output circuit side via a data line (RWD), large bus width of the data lines is one of causes that prevent a reduction in a chip area.

The operation system in the past adopts a circuit configuration in which the number of bits read out from the memory cell array according to one read command and the bus width of the data lines are the same. Specifically, in the system in the past, data later in output order and data earlier in output order are read out in parallel from the memory cell array via the main data line and transferred to the data output circuit side via the data line in parallel. Therefore, the bus width of the main data line and the bus width of the data line are the same.

In such a circuit configuration, the bus width of the data line increases as the number of prefetches increases. Therefore, the problem of the cause of prevention of a reduction in a chip area is more conspicuous as the generation of DDR advances to DDR2 and DDR3.

Japanese Patent Application Laid-Open No. 2003-308694 discloses a semiconductor device that divides data transferred by an internal data bus having large bus width and outputs the divided data to an external data bus. Japanese Patent Application Laid-Open No. 2000-10857 discloses a memory control device including a data selector that divides an output data bus of a memory and selects and outputs divided data and enabling partial use of the output data bus.

However, the invention disclosed in Japanese Patent Application Laid-Open No. 2003-308694 can reduce the bus width of the external data bus of the semiconductor device compared with the bus width of the internal data bus but cannot reduce the bus with of the internal data bus. The invention disclosed in Japanese Patent Application Laid-Open No. 2000-10857 simply enables partial use of the output data bus of the memory and does not reduce the bus width of the internal bus of the memory. In other words, Japanese Patent Application Laid-Open No. 2003-308694 and Japanese Patent Application Laid-Open No. 2000-10857 disclose nothing concerning a reduction in the bus width of the data line as a part of the internal bus of the semiconductor device. Therefore, the problem of an increase in the bus width of the data line involved in an increase in the number of prefetches cannot be solved.

BRIEF DESCRIPTION OF THE DRAWINGS

FIG. 4 is a diagram of an operation waveform of the semiconductor storage device that transmits data, which are read out from the memory cell array, on the data line in parallel;

DETAILED DESCRIPTION

In general, according to one embodiment, a semiconductor storage device includes: a memory cell array; a first selection circuit to which data read out from the memory cell array is input via a first internal bus; a second selection circuit to which the data output from the first selection circuit is input via a second internal bus; and a data output circuit to which the data output from the second selection circuit is input via a third internal bus, the semiconductor storage device outputting the data from the data output circuit to an external bus. The first internal bus, the second internal bus, and the third internal bus have bus widths decreasing stepwise from the memory cell array side to the data output circuit side. The first selection circuit and the second selection circuit divide the data, which is input via the first or second internal bus, according to a rate of a decrease in bus width in the input and the output, time-divide the divided data, and output the divided data to the second or third internal bus.

Exemplary embodiments of a semiconductor storage device and a data readout method will be explained below in detail with reference to the accompanying drawings. The present invention is not limited to the following embodiments.

Figure 1:
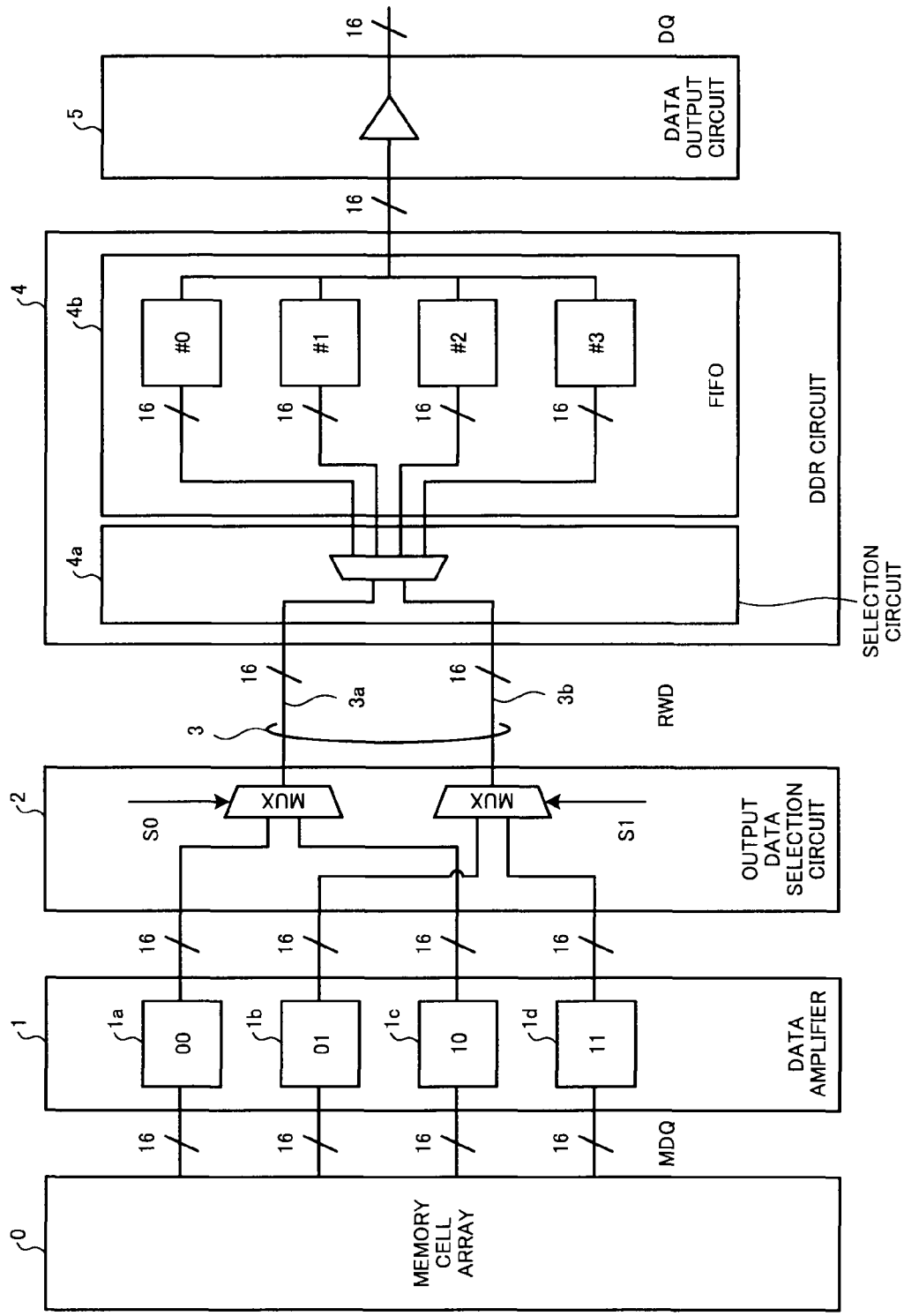
FIG. 1 is a diagram of the configuration of a semiconductor storage device according to a first embodiment.

FIG. 1 is a diagram of the configuration of a semiconductor storage device according to a first embodiment. The semiconductor storage device according to this embodiment includes a memory cell array 0, data amplifiers 1 (1*a* to 1*d*), an output data selection circuit 2, data lines 3 (3*a* and 3*b*), a DDR circuit 4, and a data output circuit 5. An input line to the data amplifier 1 is equivalent to the first internal bus, the data lines 3 are equivalent to the second internal bus, and an input line to the data output circuit is equivalent to the third internal bus.

The data amplifier 1 as a part of a first selection circuit amplifies data read out from the memory cell array 0 and outputs the data. Addresses "00", "01", "10", and "11" are allocated to the data amplifiers 1*a* to 1*d*. The output data selection circuit 2 as a part of the first selection circuit includes a multiplexer that operates based on control signals S0 and S1. The output data selection circuit 2 selects data of which of the data amplifiers 1a to 1d is output to the data lines 3. Data of the data amplifiers 1a or 1c corresponding to "00" or "01" is output to the data line 3a according to the control signal S0. Data of the data amplifier 1b or 1d corresponding to "01" or "11" is output to the data line 3b according to the control signal S1. An ON/OFF frequency of the control signals S0 and S1 (i.e., an operating frequency of the data lines 3) is twice as high as an operating frequency of the memory cell array 0. The output data selection circuit 2 outputs data to the data lines 3 at a frequency twice as high as a transmission frequency in the input line to the data amplifier 1. The DDR circuit 4 as a second selection circuit is a circuit for realizing data transfer at a DDR2. The DDR circuit 4 includes a selection circuit 4a and a first-in-first-out (FIFO) 4b. The selection circuit 4a as data dividing unit divides 64-bit data transferred from the data amplifier 1 via the data lines 3 into a former half and a latter half and outputs the data to the FIFO 4b. The FIFO 4b is divided into four areas #0 to #3. The FIFO 4b outputs the data, which is divided into four 16-bit data and input to the areas by the selection circuit 4a, to the data output circuit 5 at a frequency twice as high as that of the data lines 3 (a frequency four times as high as the operating frequency of the memory cell array 0). In other words, the DDR circuit 4 outputs the data to the data output circuit 5 at a frequency twice as high as a transmission frequency in the data lines 3.

Figure 2:
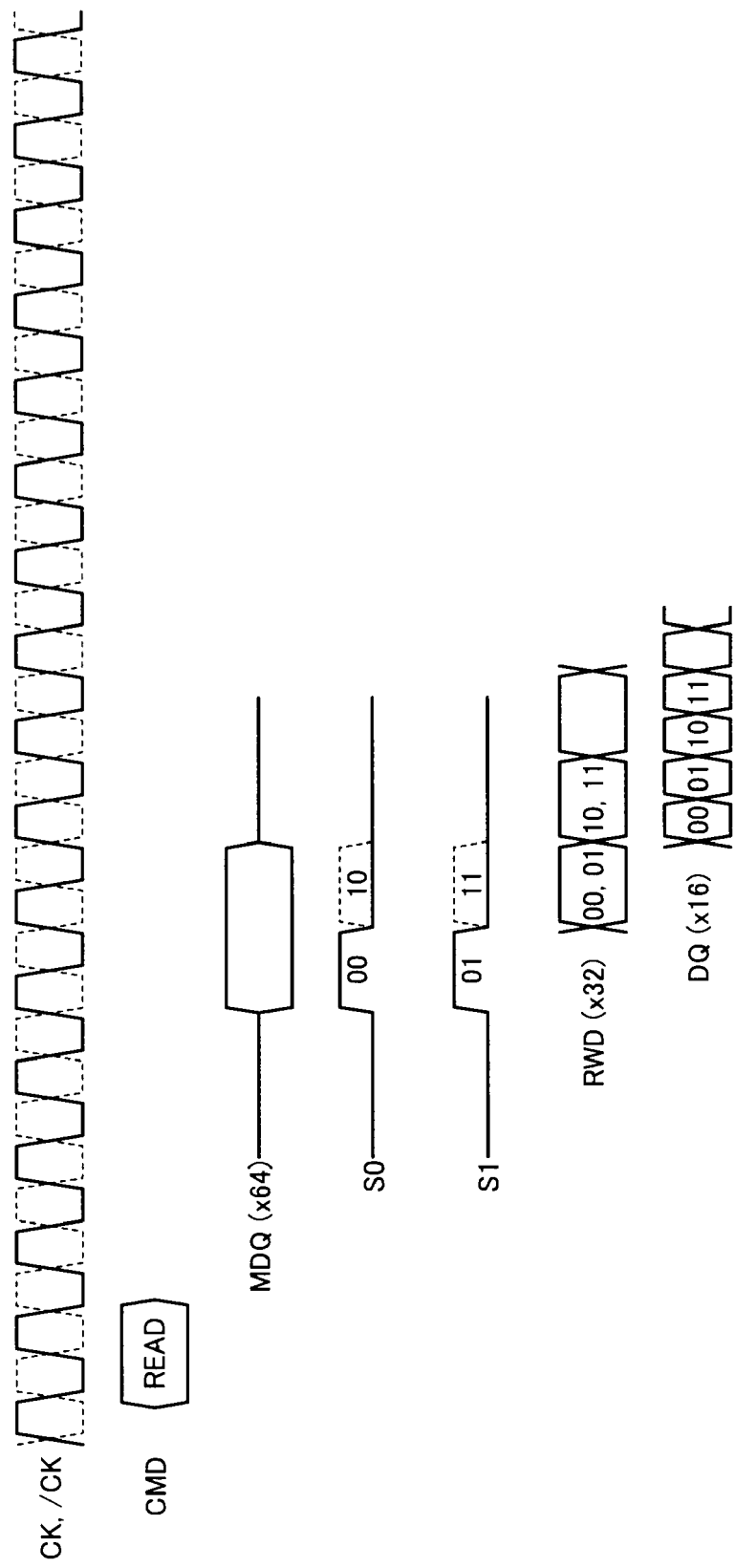
FIG. 2 is a diagram of an example of an operation waveform of the semiconductor storage device according to the first embodiment.

The operation of the semiconductor storage device according to this embodiment is explained. FIG. 2 is a diagram of an example of an operation waveform of the semiconductor storage device according to the first embodiment. A clock signal CK is an operation clock of the data lines 3 and has a frequency same as that of the control signals S0 and S1. If the clock signal CK is represented as a reference, time equivalent to 2 clocks is required for one readout of data from the memory cell array 0 to the data amplifier 1 and time equivalent to ½ clock is required for one output of data from the FIFO 4b to the data output circuit 5. In FIG. 2, CK (a solid line) represents a clock signal, /CK (a broken line) represents a counter clock, CMD represents a command, MDQ represents readout of data to the data amplifier 1 via a main data line, RWD represents transmission of data by the data lines 3a and 3b, and DQ represents output of data from the data output circuit 5. The operation waveform shown in the figure is an operation waveform in the case of CAS latency (CL)=6 but is only an example.

A read command is input to a memory controller included in the memory cell array 0 in synchronization with a rising edge of the clock signal CK at certain timing. In response to the read command, 16-bit data are read out from the memory cell array 0 to the data amplifiers 1a to 1d in parallel. When the data are read out to the data amplifiers 1a to 1d, the control signal S0 indicating "00" and the control signal S1 indicating "01" are input to the output data selection circuit 2. As a result, from the output data selection circuit 2, the data of the data amplifier 1a corresponding to "00" is output to the data line 3a and the data of the data amplifier 1b corresponding to "01" is output to the data line 3b.

The selection circuit 4a outputs, to the area #0 of the FIFO 4b, the data output from the data amplifier 1a corresponding to "00" among the 16-bit data input via the data lines 3a and 3b. The selection circuit 4a outputs, to the area #1 of the FIFO 4b, the data output from the data amplifier 1b corresponding to "01" among the 16-bit data input via the data lines 3a and 3b. The data input to the FIFO 4b are output to the data output circuit 5 in order same as the input order and at a double frequency. Specifically, the 16-bit data are output to the data output circuit 5 from the area #0 of the FIFO 4b according to the rising edge of the clock signal CK and output to the data output circuit 5 from the area #1 of the FIFO 4b according to a falling edge of the clock signal CK (according to a rising edge of the counter clock/CK) such that data is output from the data output circuit 5 in synchronization with the clock signal CK six cycles after the read command. As a result, the 16-bit data are serially output to the external bus from the data output circuit 5.

In parallel to the output of the data of the data amplifiers 1a and 1b to the data lines 3a and 3b, the control signal S0 indicating "10" and the control signal S1 indicating "11" are input to the output data selection circuit 2. As a result, from the output data selection circuit 2, the data of the data amplifier 1c corresponding to "10" is output to the data line 3a and the data of the data amplifier 1d corresponding to "11" is output to the data line 3b. In other words, the data amplifier 1 and the output data selection circuit 2 function as time division unit according to the control signals S0 and S1.

The selection circuit 4a outputs, to the area #2 of the FIFO 4b, the data output from the data amplifier 1c corresponding to "10" among the 16-bit data input via the data lines 3a and 3b. The selection circuit 4a outputs, to the area #3 of the FIFO 4b, the data output from the data amplifier 1d corresponding to "11" among the 16-bit data. The data input to the FIFO 4b are output to the data output circuit 5 in order same as the input order in synchronization with the next clock signal CK. Specifically, the 16-bit data are output to the data output circuit 5 from the area #2 of the FIFO 4b according to the rising edge of the clock signal CK and output to the data output circuit 5 from the area #3 of the FIFO 4b according to the falling edge of the clock signal CK (according to the rising edge of the counter clock/CK) such that data is output from the data output circuit 5 in synchronization with the clock signal CK seven cycles after the read command. As a result, the 16-bit data are serially output to the external bus from the data output circuit 5.

As explained above, in the semiconductor storage device according to this embodiment, the bit width of the data lines 3 that transmit the output data from the data amplifier 1 only has to be a half of the bit width of the data input line from the memory cell array 0. Therefore, a reduction in a chip area can be realized. Specifically, the output from the memory cell array 0 (the inputs to the data amplifiers 1a to 1d), the output of the output data selection circuit 2, and the output of the DDR circuit 4 decreases stepwise from 64 bits to 32 bits and to 16 bits. Therefore, the bus width of the internal bus can be reduced. It is unnecessary to transmit a synchronization signal or the like separately from the data. Therefore, it is possible to efficiently reduce the bus width.

Figure 3:
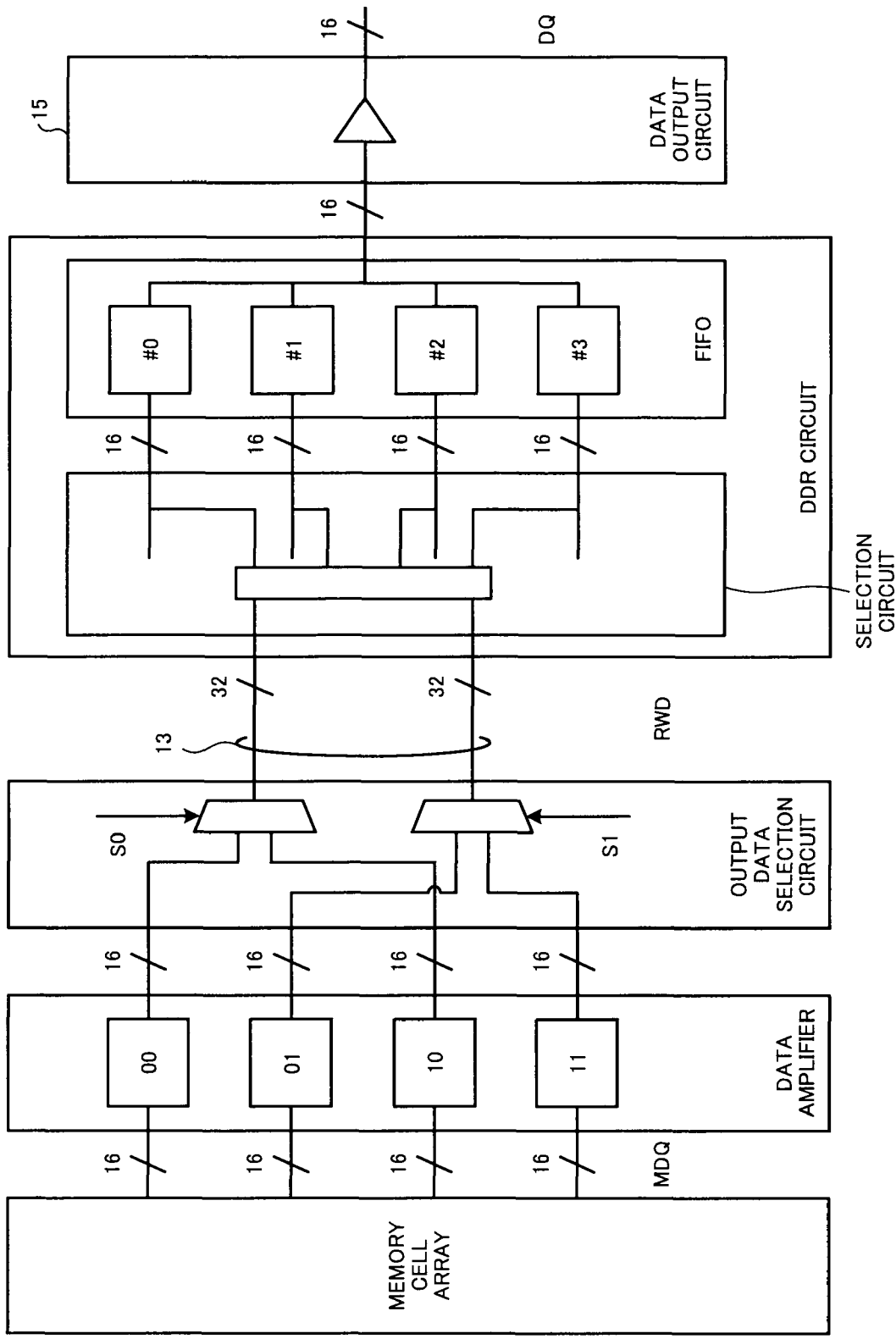
FIG. 3 is a diagram of the configuration of a semiconductor storage device that transmits data, which are read out from a memory cell array, on a data line in parallel.

In this embodiment, the data read out from the memory cell array 0 are not transmitted in parallel on the data lines 3 (i.e., a part of the data is delayed). However, if DDR2 transfer is adopted, the output from the data output circuit 5 are serialized at any rate. Therefore, no problem occurs even if the data are serialized at a stage before the data are input to the FIFO 4b. For comparison, the configuration of a semiconductor storage device that transmits data, which are read out from a memory cell array, on a data line in parallel is shown in FIG. 3. An operation waveform of the semiconductor storage device that transmits data, which are read out from a memory cell array, on a data line in parallel is shown in FIG. 4. Even when the data read out from the memory cell array are transmitted on the data line 13 in parallel as shown in the figures, if the DDR2 transfer is adopted, outputs from the data output circuit 15 are finally serialized. Therefore, in this embodiment, the delay of a part of the data on the data lines 3 of the semiconductor storage device does not cause any problem.

Figure 5A:
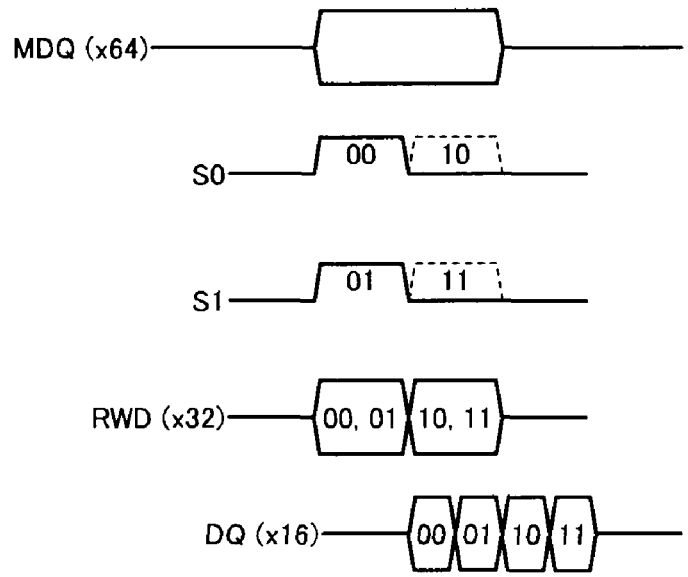
FIG. 5A is a diagram of an operation waveform with a start address set to "00"
Figure 5B:
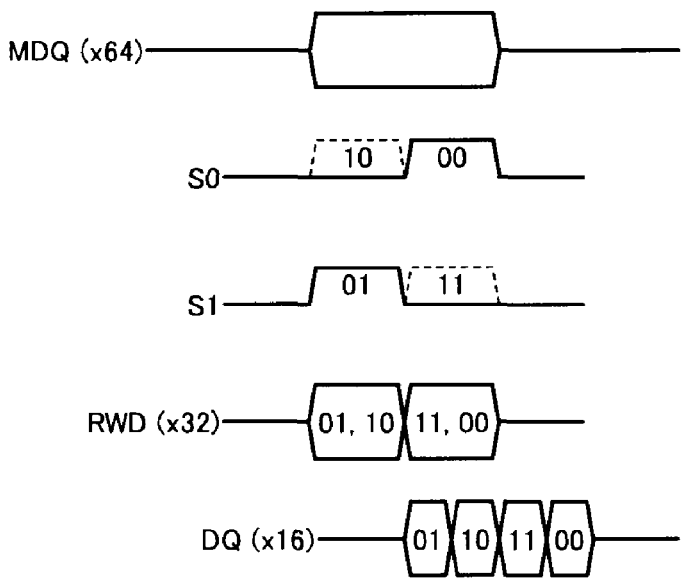
FIG. 5B is a diagram of an operation waveform in a sequential operation with a start address set to "01"
Figure 5C:
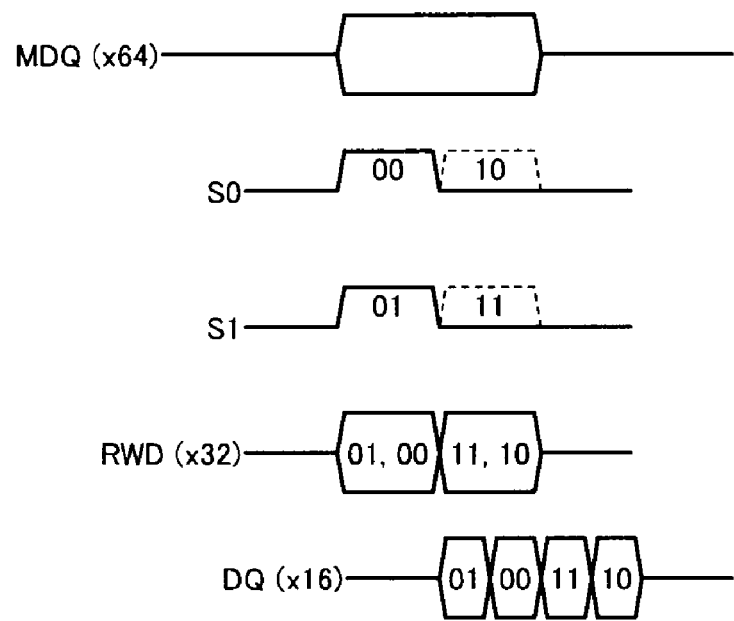
FIG. 5C is a diagram of an operation waveform in an interleave operation with a start address set to "01"

It is also possible to rearrange the order of the data output from the data output circuit 5 by designating a start address with the control signals S0 and S1 and designating a sequential operation or an interleave operation. FIGS. 5A to 5C are diagrams of operation waveforms with the start address set to "00" and "01". When the start address is "00", the output order of the data is the same irrespective of which of the sequential operation and the interleave operation is designated. On the other hand, when the start address is "01", the output order of the data is different when the sequential operation is designated and when the interleave operation is designated. Therefore, when the start address is "01", the operation waveform of the sequential operation and the operation waveform of the interleave operation are shown in the separate figures. The output orders of the data shown in FIGS. 5A to 5C coincide with data output orders in the sequential operation and the interleave operation at burst length BL=4 in a DDR interface. In other words, the semiconductor storage device according to this embodiment can cope with the sequential and interleave operations requested when the DDR interface is adopted.

The semiconductor storage device according to this embodiment can also be caused to operate at burst length BL=8. When the semiconductor storage device is caused to operate at the burst length BL=8, the operation at the burst length BL=4 explained with reference to FIGS. 2 and 5A to 5C is continuously performed twice with a memory address changed.

Figure 6:
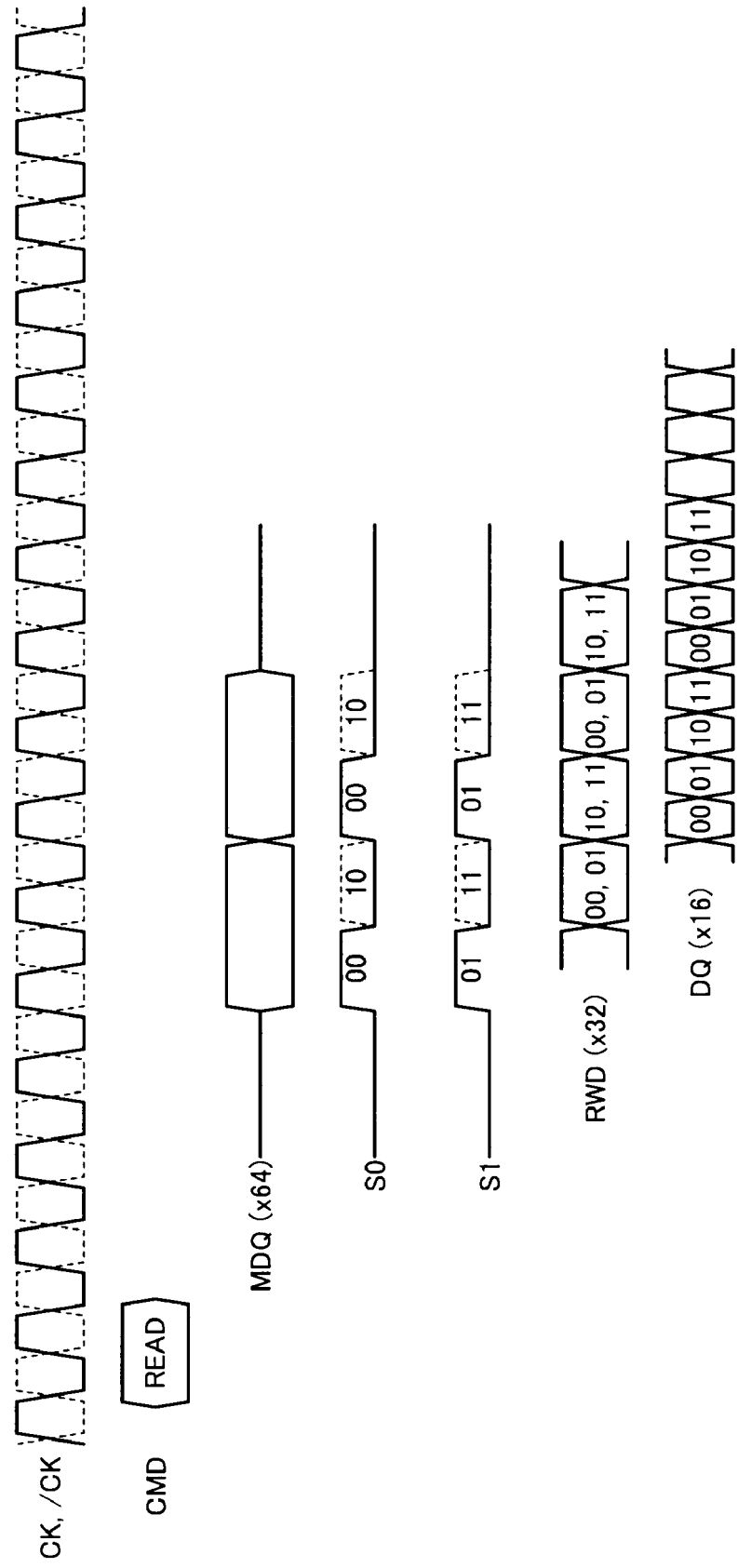
FIG. 6 is a diagram of an operation waveform in operation at burst length BL=8.

An example of an operation waveform in the case of the burst length BL=8 is shown in FIG. 6. In the case of the burst length BL=8, 64-bit data is read out from the memory cell array 0 twice according to one read command. Therefore, data transmitted by the data lines 3 has 128 bits in total. Consequently, a pulse rises four times in each of the control signals S0 and S1 and 32-bit data is output to the data lines 3 four times in a row.

In this case, the data is stored in each of the areas #0 to #3 of the FIFO 4b twice and 16-bit data is output to the data output circuit 5 eight times in a row. When the data is stored in each of the areas of the FIFO 4b for the second time, the data stored for the first time is already output to the data output circuit 5. Therefore, if the semiconductor storage device includes a sufficient number of FIFOs, problems such as a delay and a loss of data do not occur. Therefore, the semiconductor storage device according to this embodiment can cope with both the burst length BL=4 and the burst length BL=8. It is also possible to cause the semiconductor storage device to operate at burst length BL=4n (n is an integer equal to or larger than 3) by repeating the same operation three or more times while changing a memory address.

Figure 7:
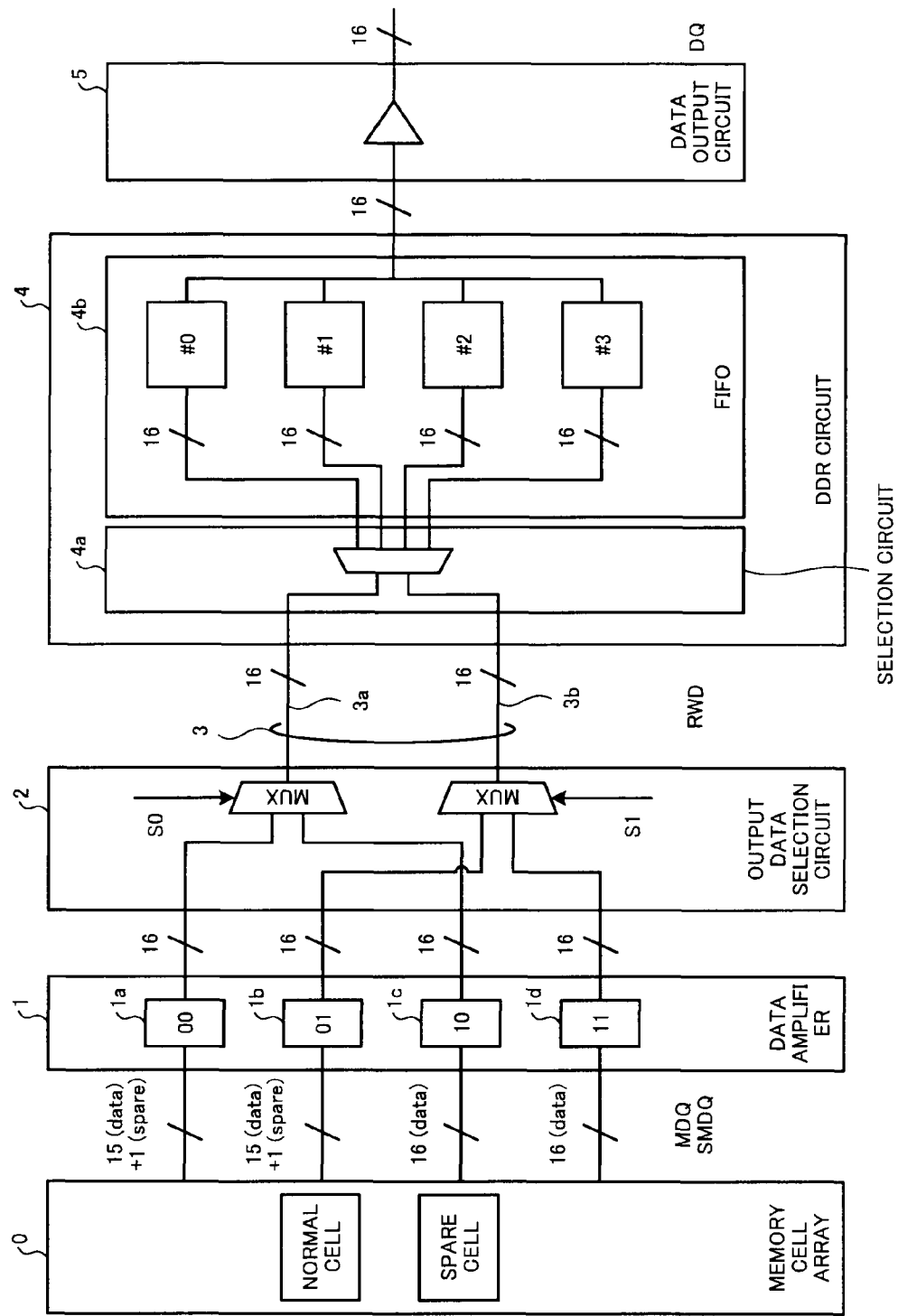
FIG. 7 is a diagram of the configuration of a semiconductor storage device according to a second embodiment.

FIG. 7 is a diagram of the configuration of a semiconductor storage device according to a second embodiment. The semiconductor storage device according to this embodiment has a configuration substantially the same as that in the first embodiment. However, the memory cell array 0 includes a spare cell in addition to a normal cell. The data amplifier 1 can read out data from the spare cell of the memory cell array 0. One of data input lines to the data amplifiers 1a and 1b is switched to a data input line for readout from the spare cell.

Numbers <0> to <15> are assigned to sixteen data input lines in total included in each of the data amplifiers 1a to 1d to distinguish the data input lines. It is assumed that the data input line <0> among the sixteen data input lines <0> to <15> of the data amplifier 1a and the data input line <0> among the sixteen data input lines <0> to <15> of the data amplifier 1b are switched to data input lines for readout from the spare cell. The switching to data input lines for readout from the spare cell is performed by writing defective cell information in a programmable read only memory (ROM) such as a fuse ROM. The data line 3a includes sixteen data lines RWD<0> to RWD<15> and the data line 3b includes sixteen data lines RWD<16> to RWD<31>.

Figure 8:
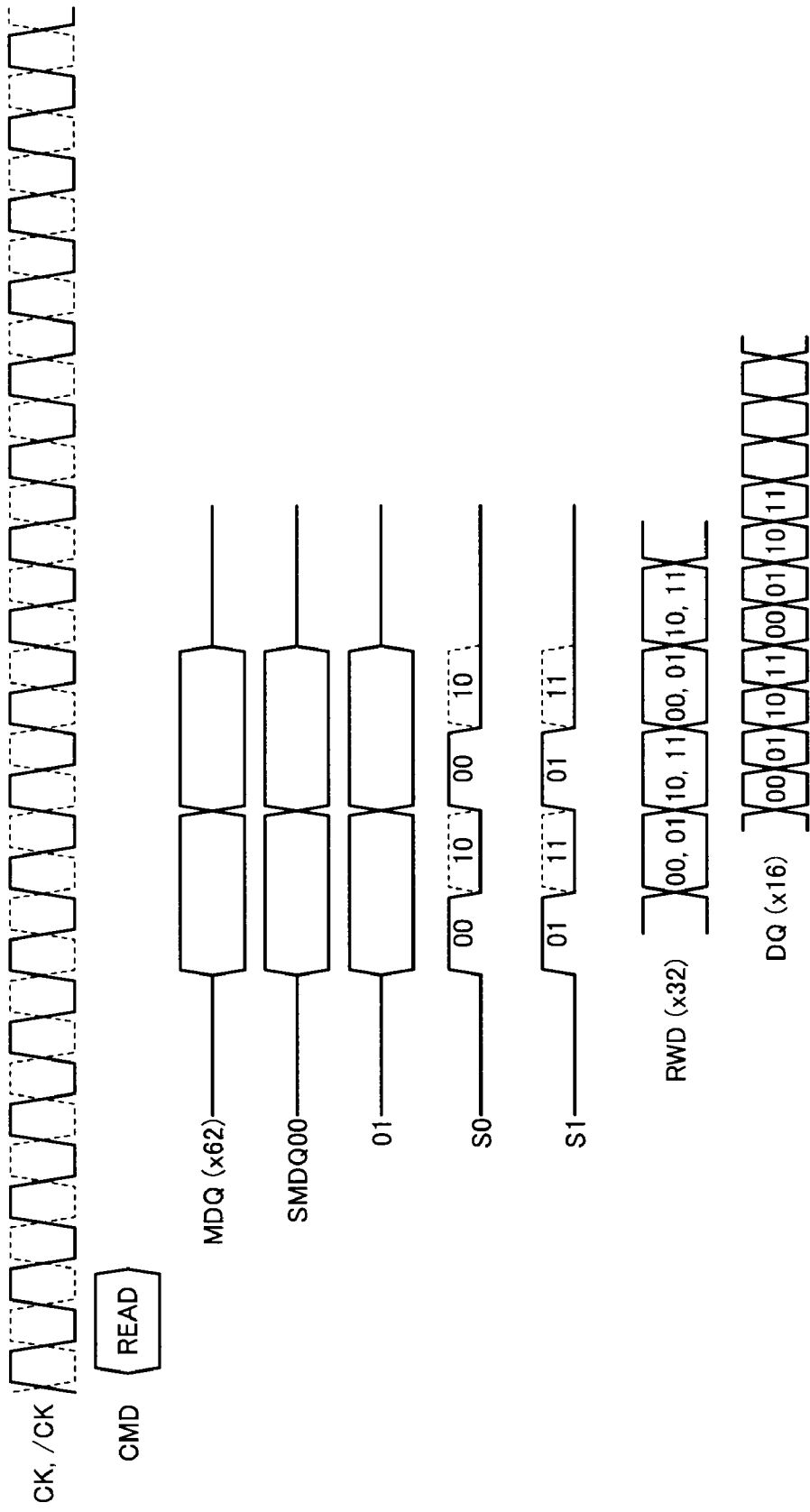
FIG. 8 is a diagram of an example of an operation waveform of the semiconductor storage device according to the second embodiment.

FIG. 8 is a diagram of an example of an operation waveform of the semiconductor storage device according to the second embodiment. In FIG. 8, SMDQ00 and SMDQ01 indicate readout of data to the data amplifiers 1a and 1b via the data input lines switched for readout of data from the spare cell. Otherwise, the operation waveform is the same as that shown in FIG. 2. When the data is output from the data amplifier 1 to the data lines 3 for the first time, among the data output from the data amplifier 1a corresponding to "00", the data read out from the spare cell is transmitted by the data line RWD<0> of the data line 3a and the data read out from the normal cell is transmitted by the data lines RWD<1> to RWD<15> of the data line 3a. Similarly, among the data output from the data amplifier 1b corresponding to "01", the data read out from the spare cell is transmitted by the data line RWD<16> of the data line 3b and the data read out from the normal cell is transmitted by the data lines RWD<17> to RWD<31> of the data line 3b.

When the data is output from the data amplifier 1 to the data lines 3 for the second time, the data output from the data amplifier 1c corresponding to "10" is transmitted by the data lines RWD<0> to RWD<15> of the data line 3a. The data output from the data amplifier 1d corresponding to "11" is transmitted by the data lines RWD<16> to RWD<31> of the data line 3b.

When the data is output from the data amplifier 1 to the data lines 3 for the third time, among the data output from the data amplifier 1a corresponding to "00", the data read out from the spare cell is transmitted by the data line RWD<0> of the data line 3a and the data read out from the normal cell is transmitted by the data lines RWD<1> to RWD<15> of the data line 3a. Similarly, among the data output from the data amplifier 1b corresponding to "01", the data read out from the spare cell is transmitted by the data line RWD<16> of the data line 3b and the data read out from the normal cell is transmitted by the data lines RWD<17> to RWD<31> of the data line 3b.

When the data is output from the data amplifier 1 to the data lines 3 for the fourth time, the data output from the data amplifier 1c corresponding to "10" is transmitted by the data lines RWD<0> to RWD<15> of the data line 3a. The data read out from the data amplifier 1d corresponding to "11" is transmitted by the data lines RWD<16> to RWD<31> of the data line 3b.

As it is evident from FIG. 8, even when an output from the data output circuit 5 includes the data read out from the spare cell, the output is the same as an output including data, all of which are read out from the normal cell.

In this way, the semiconductor storage device according to this embodiment can cope with the readout of data from the spare cell. Therefore, even if a part of memory cells is defective, it is possible to replace the memory cell with the spare cell and cause the memory cell array to normally operate. This makes it possible to realize improvement of yield of the semiconductor storage device.

Figure 9:
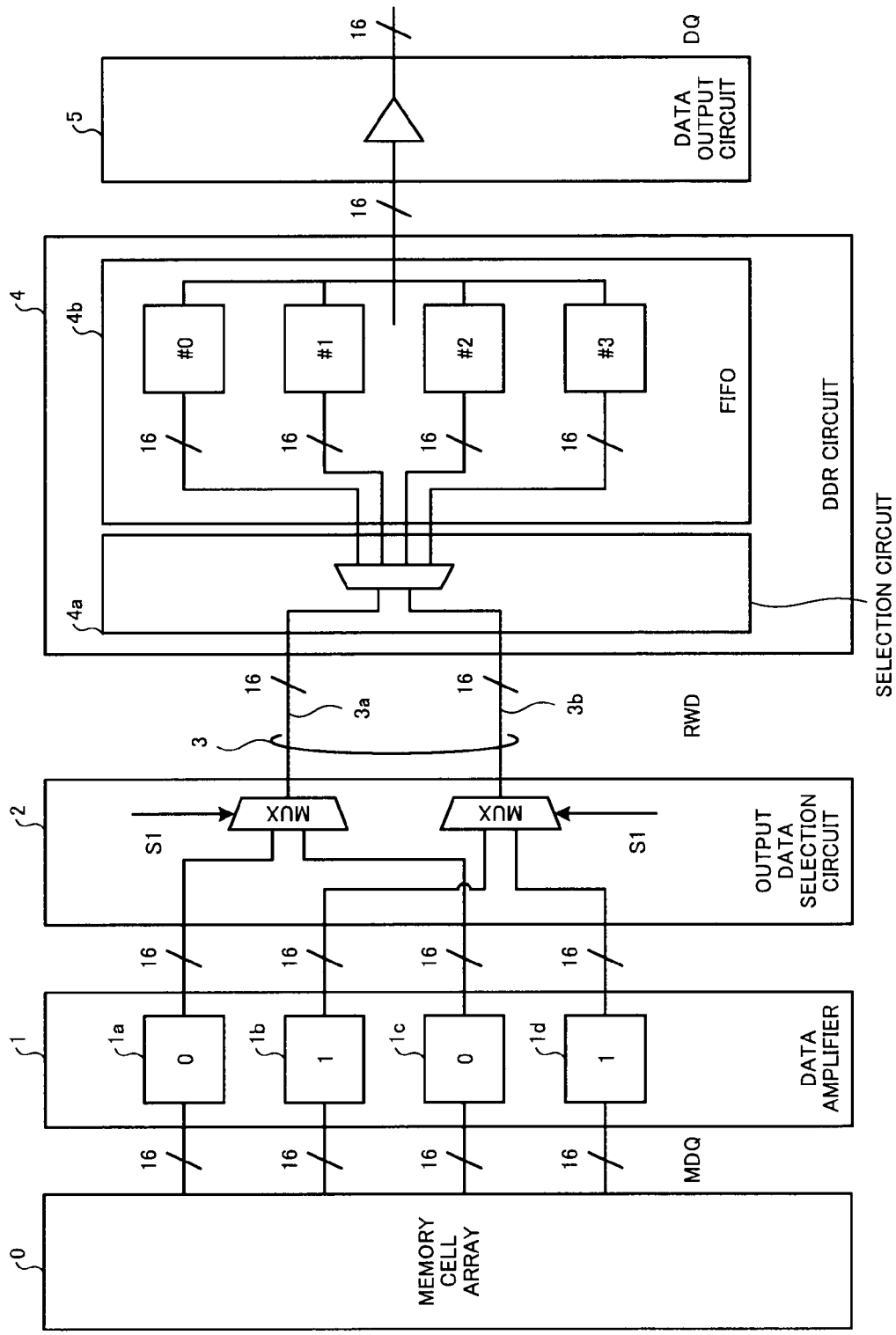
FIG. 9 is a diagram of the configuration of a semiconductor storage device according to a third embodiment.
Figure 10:
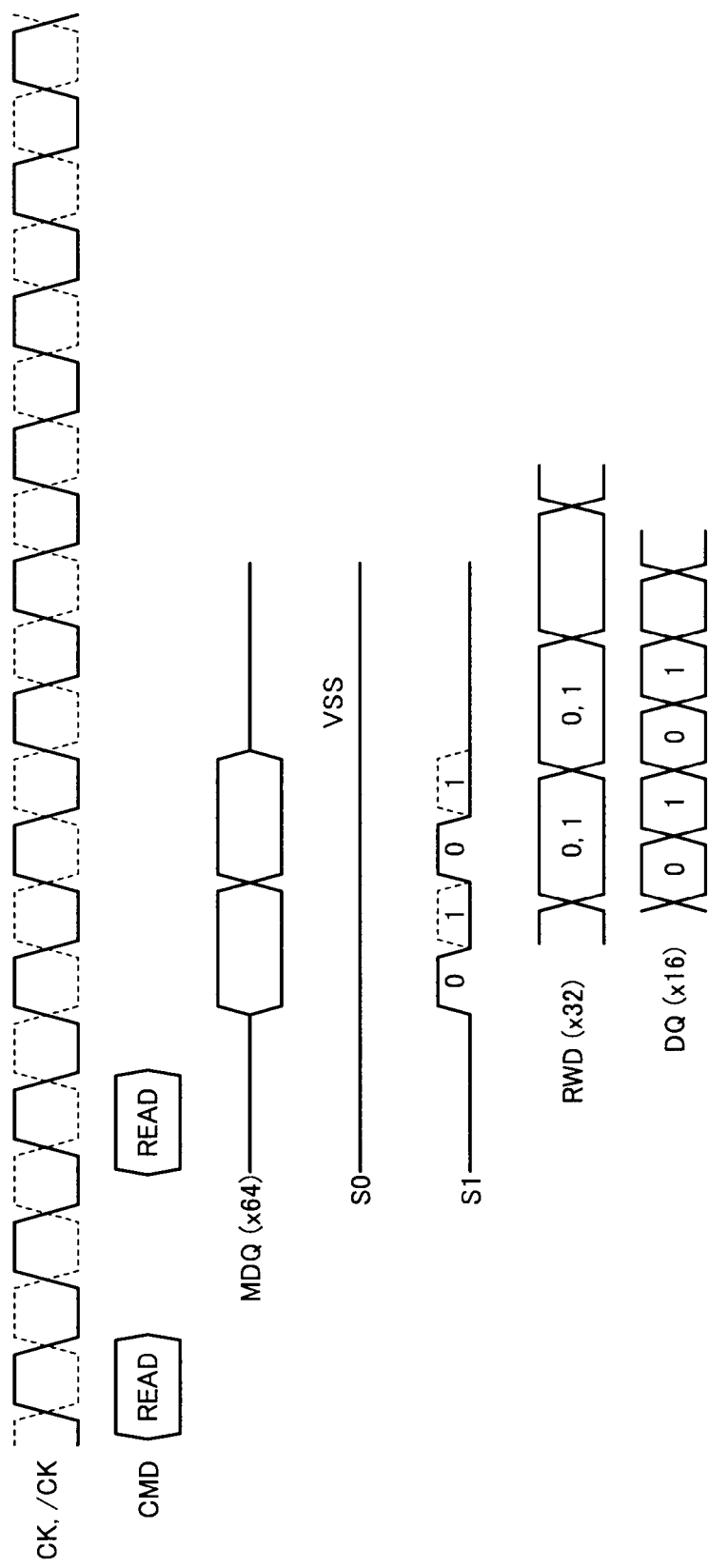
FIG. 10 is a diagram of an example of a waveform of the semiconductor storage device according to the third embodiment.

FIG. 9 is a diagram of the configuration of a semiconductor storage device according to a third embodiment. FIG. 10 is a diagram of an example of an operation waveform of the semiconductor storage device according to the third embodiment. The semiconductor storage device according to this embodiment has a configuration substantially the same as that in the first embodiment. However, data read out to the data amplifier 1 in response to one read command is 32-bit data.

16-bit data are respectively input to the data amplifiers 1*a* and 1*c* and the data amplifiers 1*b* and 1*d*. An address "0" is allocated to the data amplifiers 1*a* and 1*c* and an address "1" is allocated to the data amplifiers 1*b* and 1*d*. The control signal S0 is fixed to VSS. The output data selection circuit 2 selects data based on only the control signal S1. In other words, the data amplifier 1 and the output data selection circuit 2 function as selecting unit according to the control signal S1. The 16-bit data output from the output data selection circuit 2 are transferred in parallel at a time by the data lines 3*a* and 3*b*.

A frequency of the clock signal CK as an operation clock of the data lines 3 is the same as a frequency of readout of data to the data amplifier 1 (an operating frequency of the memory cell array 0).

The selection circuit 4*a* outputs, to the area #0 of the FIFO 4*b*, the data output from the data amplifier 1*a* corresponding to "0" among the 16-bit data input via the data lines 3*a* and 3*b*. The selection circuit 4*a* outputs, to the area #1 of the FIFO 4*b*, the data output from the data amplifier 1*b* corresponding to "1" among the 16-bit data input via the data lines 3*a* and 3*b*. The data input to the FIFO 4*b* are output to the data output circuit 5 in order same as the input order in synchronization with the next clock signal CK. Specifically, the 16-bit data is output from the area #0 of the FIFO 4*b* to the data output circuit 5 according to a rising edge of the next clock signal CK. The 16-bit data is output from the area #1 of the FIFO 4*b* to the output circuit 5 according to a falling edge of the next clock signal CK (a rising edge of the counter clock/CK). As a result, the 16-bit data are serially output from the data output circuit 5 to the external bus.

In this embodiment, as in the embodiments explained above, the data read out from the memory cell array 0 are not transmitted in parallel on the data lines 3 (i.e., a part of the data is delayed). However, if DDR transfer is adopted, the output from the data output circuit 5 are serialized at any rate. Therefore, no problem occurs even if the data are serialized at a stage before the data are input to the FIFO 4*b*. A circuit configuration is the same as that in the first embodiment. Therefore, the data read out to the data amplifier 1 in response to one read command can be switched between 64-bit data and 32-bit data. This makes it possible to provide compatibility with the DDR2.

As explained above, the semiconductor storage device according to this embodiment can read out data in DDR transfer from the memory cell array.

In the example of the configuration explained the embodiments, the bit width of the outputs of the data amplifiers 1*a* to 1*d*, the bit width of the output of the output data selection circuit 2, and the bit width of the output of the DDR circuit 4 decrease at two stages by a half at a time from 64 bits to 32 bits and to 16 bits. However, the decrease in the bus width is not limited to a half. A rate of a decrease in bus width does not need to be the same for all the outputs. The bus width can also decrease at a rate such as a rate of decrease from 96 bits to 32 bits and to 16 bits. However, when a difference in the rate of a decrease in bus width is large, it is conceivable that waiting time occurs in processing for reducing bit width of data, leading to a fall in efficiency. If the rate of a decrease in bus width is the same for all the outputs, waiting time in the processing for reducing bit width of data does not occur. Therefore, it is possible to efficiently transfer the data.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a memory cell array;
   a first selection circuit to which data read out from the memory cell array is input via a first internal bus;
   a second selection circuit to which the data output from the first selection circuit is input via a second internal bus; and
   a data output circuit to which the data output from the second selection circuit is input via a third internal bus,
   the semiconductor storage device outputting the data from the data output circuit to an external bus, wherein
   the first internal bus, the second internal bus, and the third internal bus have bus widths decreasing stepwise from the memory cell array side to the data output circuit side, and
   the first selection circuit and the second selection circuit divide the data, which is input via the first or second internal bus, according to a rate of a decrease in bus width in the input and the output, time-divide the divided data, and output the divided data to the second or third internal bus.

2. The semiconductor storage device according to claim 1, wherein
   the second selection circuit includes:
      a data dividing unit that divides the data, which is transmitted via the second internal bus, according to a rate of a decrease in bus width from the bus width of the second internal bus to the bus width of the third internal bus; and
      an FIFO that stores the data divided by the data dividing unit, and
   the second selection circuit time-divides the data stored in the FIFO and outputs the data to the third internal bus at a frequency obtained by multiplying a transmission frequency in the second internal bus with a number of divisions in the data dividing unit.

3. The semiconductor storage device according to claim 2, wherein
   the first selection circuit includes a time division unit that time-divides the data input via the first internal bus, and
   the first selection circuit time-divides, with the time division unit, the data input via the first internal bus according to a rate of a decrease in bus width from the bus width of the first internal bus to the bus width of the second internal bus and outputs the time-divided data to the second internal bus at a frequency multiplied by a number of time divisions in the time division unit.

4. The semiconductor storage device according to claim 3, the time division unit includes:
   a data amplifier that divides the data input via the first internal bus and stores the divided data; and
   a multiplexer that extracts the divided data stored in the data amplifier in order.

5. The semiconductor storage device according to claim 2, wherein
   the first selection circuit includes a selecting unit that selects a part of the data input via the first internal bus, and
   the first selection circuit selects, with the selecting unit, data redundantly input via the first internal bus and having a number of bits same as the bus width of the second internal bus such that the data are not redundant and outputs the selected data to the second internal bus at a frequency same as a readout frequency from the memory cell array.

6. The semiconductor storage device according to claim 5, wherein the selecting unit includes:
a data amplifier that divides the data input via the first internal bus and stores the divided data; and
a multiplexer that selectively extracts the divided data stored in the data amplifier.

7. The semiconductor storage device according to claim 2, wherein
the first selection circuit includes:
a time division unit that time-divides the data input via the first internal bus; and
a selecting unit that selects a part of the data input via the first internal bus,
when data having a number of bits same as the bus width of the first internal bus is input to the first selection circuit via the first internal bus, the first selection circuit time-divides, with the time division unit, the input data according to a rate of a decrease in bus width from the bus width of the first internal bus to the bus width of the second internal bus and outputs the divided data to the second internal bus at a frequency multiplied by a number of time divisions in the time division unit, and
when data having a number of bits same as the bus width of the second internal bus is redundantly input via the first internal bus, the first selection circuit selects, with the selecting unit, the input data such that the input data are not redundant and outputs the selected data to the second internal bus at a frequency same as a readout frequency from the memory cell array.

8. The semiconductor storage device according to claim 7, wherein
the first selection circuit includes:
a data amplifier that divides the data input via the first internal bus and stores the divided data; and
a multiplexer that extracts the divided data stored in the data amplifier, and
the data amplifier and the multiplexer function as the time division unit when the multiplexer extracts the divided data stored in the data amplifier in order and function as the selecting unit when the multiplexer selectively extracts the divided data stored in the data amplifier.

9. The semiconductor storage device according to claim 1, wherein a rate of a decrease in bus width in the first internal bus and the second internal bus and a rate of a decrease in bus width in the second internal bus and the third internal bus are the same.

10. The semiconductor storage device according to claim 9, wherein the bus width of the second internal bus is a half of the bus width of the first internal bus and the bus width of the third internal bus is a half of the bus width of the second internal bus.

11. The semiconductor storage device according to claim 1, wherein the first selecting circuit includes a unit that selects order of time division of the data output to the second internal bus.

12. The semiconductor storage device according to claim 1, wherein the memory cell array includes:
a normal cell;
a spare cell that can output data to the first internal bus in place of the normal cell; and
a unit that switching output of data from the normal cell to the first internal bus and output of data from the spare cell to the first internal bus.

13. The semiconductor storage device according to claim 1, wherein, in one data readout operation, data having a number of bits same as the bus width of the first internal bus and having different memory addresses are continuously read out from the memory cell array and input to the first selection circuit via the first internal bus.

14. A semiconductor storage device that outputs data read out from a memory cell array to an external bus via internal buses at a plurality of stages, wherein
the internal buses at the stages have bus widths decreasing stepwise from the memory cell array side to the external bus side, and
in places where the bus widths of the internal buses decrease, input data is divided according to a rate of a decrease in bus width in the internal bus on an input side and the internal bus on an output side and the divided data is time-divided and output to the internal bus on the output side.

15. The semiconductor storage device according to claim 14, wherein, in the places where the bus widths of the internal buses decrease, the divided data is output to the internal bus on the output side at a frequency obtained by multiplying a transmission frequency in the internal bus on the input side with a number of divisions.

16. The semiconductor storage device according to claim 15, wherein rates of a decrease in bus width in the places where the bus widths of the internal buses decrease are the same.

17. A data readout method for outputting data read out from a memory cell array to an external bus via internal buses at a plurality of stages having bus widths decreasing stepwise from the memory cell array side to the external bus side, the data readout method comprising:
dividing, in places where the bus widths of the internal buses decrease, input data according to a rate of a decrease in bus width in the internal bus on an input side and the internal bus on an output side;
time-dividing the divided data; and
outputting the divided data to the internal bus on the output side.

18. The data readout method according to claim 17, further comprising outputting, in the places where the bus widths of the internal buses decrease, the divided data to the internal bus on the output side at a frequency obtained by multiplying a transmission frequency in the internal bus on the input side with a number of divisions.

19. The data readout method according to claim 18, further comprising reducing, in the places where the bus widths of the internal buses decrease, the bus widths at a same rate.

* * * * *